METHOD OF MANUFACTURING SEMICONDUCTOR DEVICES SUCH AS TRANSISTORS AND DIODES AND SEMICONDUCTOR DEVICES MANUFACTURED BY SUCH METHODS

Filed June 9, 1964 2 Sheets-Sheet 1

INVENTOR.
WALTER STEINMAIER
BY
Frank R. Trifari
AGENT

METHOD OF MANUFACTURING SEMICONDUCTOR DEVICES SUCH AS TRANSISTORS AND DIODES AND SEMICONDUCTOR DEVICES MANUFACTURED BY SUCH METHODS

Filed June 9, 1964 2 Sheets-Sheet 2

INVENTOR.
WALTER STEINMAIER
BY
Frank R. Trifari
AGENT

United States Patent Office 3,386,857

Patented June 4, 1968

3,386,857

METHOD OF MANUFACTURING SEMICONDUCTOR DEVICES SUCH AS TRANSISTORS AND DIODES AND SEMICONDUCTOR DEVICES MANUFACTURED BY SUCH METHODS

Walter Steinmaier, Mollenhutseweg, Nijmegen, Netherlands, assignor to North American Philips Company, Inc., New York, N.Y., a corporation of Delaware Filed June 9, 1964, Ser. No. 373,755
Claims priority, application Netherlands, June 10, 1963, 293,863
6 Claims. (Cl. 117—212)

ABSTRACT OF THE DISCLOSURE

The method of manufacturing a semiconductor device having a semiconductor body on a surface of which is provided a silicon oxide layer. The method involves subjecting the silicon oxide covered semiconductor to a silicon compound containing gas at a flow rate and while heating the semiconductor at a temperature which thermally decomposes the gas liberating silicon which selectively removes those oxide portions contacted. A further feature of the invention is that by continuing the process until the underlying semiconductor is exposed, silicon will deposit as a growth onto the semiconductor. A further feature of the invention is to carry out in a single reaction vessel the selective removal of an oxide layer from a semiconductor and the epitaxial growth on the exposed semiconductor surface portions of another semiconductor.

This invention relates to methods of manufacturing semiconductor devices, such as transistors and diodes, start being made from a semiconductor body having, at least locally, a surface layer of silicon oxide which is removed at least locally, whereafter on the semiconductor surface that has thus come free a silicon layer is grown by leading over a gas containing a silicon compound from which silicon deposits on the said semiconductor surface due to thermal reactions as a result of heating of the semiconductor body. The invention also relates to semiconductor devices manufactured by the use of a method according to the invention.

In known methods of the above-mentioned kind the silicon-oxide layer is locally removed, for example, in the manner which is usual in the semiconductor technique, with the aid of a photo-setting lacquer (sometimes referred to as "photoresist") and an etchant, whereafter the semiconductor body is introduced into a reaction vessel for the growth of the silicon layer.

It has been found possible selectively to grow a silicon layer on the semiconductor surface that has come free, that is to say that no or substantially no silicon is permanently deposited on the silicon-oxide layer. To this end, a gas as usually employed in the semiconductor technique for depositing silicon from the gaseous phase due to thermal reactions may be led over the heated semiconductor body, for example, a gas consisting of hydrogen to which silicon chloride has been added. Selective epitaxial deposition of silicon is described by R. D. Joyce and J. A. Baldrey in Nature, vol. 195, Aug. 4, 1962, p. 485–486.

These known methods have the disadvantage that the semiconductor body is subjected to several treatments with several chemical agents in several reaction vessels. A considerable risk of undesirable contamination of the semiconductor body is thus involved, especially during the transfer of the semiconductor body to another reaction vessel.

It is an object of the invention inter alia to minimize the risk of contamination and simplify such methods.

According to the invention, a method of the kind mentioned in the preamble is characterized in that the silicon-oxide layer is removed at least locally and the silicon layer is grown in succession in the same reaction vessel and that the silicon-oxide layer is removed, at least locally, likewise by leading over a gas containing a silicon compound from which silicon can be deposited by means of thermal reactions, the rate of flow of the gas and the temperature of the semiconductor body being adjusted to values at which silicon can be liberated from the gas, while substantially no silicon is deposited permanently on the silicon-oxide layer.

The invention is based inter alia on the surprising recognition that gases usable for selectively depositing silicon on a carrier body by means of thermal reactions may also be used for removing, at least locally, the silicon-oxide layer, so that the whole of the method may be carried out in a simple manner in one reaction vessel, thus also minimizing the risk of contamination of the semiconductor body.

The same gas may simply be led over during the removal of the oxide layer and the growth of the silicon layer. The removal of the oxide layer then automatically changes to the growth of the silicon layer. However, it is also possible to lead over different gases during the removal of the oxide layer and the growth of the silicon layer, or the ratio of the constituents contained in the gas being led over during the removal of the oxide layer may be varied at the beginning of the deposition of the silicon layer, while also the rate of flow of the gases and/or the temperature of the semiconductor body may be varied in order thus to adjust optimum conditions during the removal of the oxide layer as well as during the growth of the silicon layer. These optimum conditions may be dependent, for example, upon the semiconductor device one wants to manufacture, upon the semiconductor body itself and upon the apparatus used.

Very favourable results are obtained when leading over a gas consisting of hydrogen to which a silicon-halogen compound, for example silicon chloride, has been added, although satisfactory results may also be obtained with other gases usually employed for the deposition of silicon by means of thermal reactions. Thus, the gas may alternatively contain, for example, a silicon halogen-hydrogen compound or silane.

It has also been found advantageous if the semiconductor body is maintained at a temperature of at least about 1200° C., preferably at a temperature between 1250° C. and 1350° C., during the at least local removal of the silicon-oxide layer and preferably also during the growth of the silicon layer.

It is to be noted that during the at least local removal of the silicon-oxide layer and preferably also during the growth of the silicon layer, the rate of flow of the gas in the vicinity of the semiconductor body is preferably comparatively low, for example lower than 30 cm. per minute.

A method according to the invention is especially important in cases where the silicon-oxide layer must be locally removed. The silicon-oxide layer may be locally removed while the areas which are not to be removed are covered with a separate mask.

Such a separate mask preferably comprises a plate provided with removed portion and made from a material which can withstand the temperatures to which the semiconductor body is heated, such as, for example, quartz, silicon, tungsten, molybdenum or graphite, while a surface of the plate which has been ground optically flat is brought into contact with the silicon-oxide layer. The silicon-oxide layer may then be removed at the said removed portions. Such a plate may mechanically be placed on the silicon-oxide layer in the reaction vessel in a simple manner and, if desired, also be removed therefrom.

Polycrystalline silicon may deposit on the plate but readily be removed together with the plate.

A separate mask is not required during the growth of the silicon layer since, as previously mentioned, the silicon layer may be grown selectively.

A separate mask during the local removal of the silicon-oxide layer is avoided in a further preferred embodiment which is characterized in accordance with the invention in that the silicon-oxide layer provided on the semiconductor body has thin and thick portions, the silicon-oxide layer being removed only at the thin portions and the silicon layer being grown on the semiconductor surface that thus becomes exposed, while at the thick portions only the thickness of the silicon-oxide layer is decreased.

It is very advantageous to provide the silicon-oxide layer on the semiconductor body in the same reaction vessel in which the silicon-oxide layer is locally removed and the silicon layer is grown, preferably by leading over a gas from which silicon oxide may be deposited on the semiconductor body due to thermal reactants. It will be evident that the method becomes simpler and the risk of undesirable contamination of the semiconductor body becomes smaller as more necessary operations may be performed in the same reaction vessel.

It is possible, for example, by means of thermal dissociation, to deposit silicon oxide on the semiconductor body by leading over a gas containing, for example, one or more of the compounds methyl silicate and ethyl silicate and the alkoxy silanes, as described in a copending application, Ser. No. 285,406, filed June 4, 1963, now U.S.P. 3,331,716.

The same gas which is used for the at least local removal of the silicon-oxide layer may also be led over for producing the silicon-oxide layer, in which event oxygen is added to the gas. If the gas is, for example, hydrogen to which a silicon halogen compound has been added, it is possible to add oxygen in a form which induces forming of water vapour, for example, oxygen in the form of carbon dioxide.

During the provision of the silicon-oxide layer, the thickness of the oxide layer to be applied may be locally restricted with the aid of a mask, resulting in a silicon-oxide layer having thick and thin portions. As previously mentioned, the use of a separate mask during the at least local removal of the silicon-oxide layer may in this case be avoided.

For the manufacture of many kinds of semiconductor devices it is desirable that the semiconductor body should have a surface layer having properties different from those of the remainder of the semiconductor body. Thus, the semiconductor body may comprise, for example, a low-ohmic carrier body having a high-ohmic surface layer of a conductivity type similar to that of the carrier body. A p-n junction with the high-ohmic surface layer having a high breakdown voltage may then be formed, while the low-ohmic body, which may be provided with a terminal contact, limits the series-resistance of the semiconductor body. Also for certain uses the semiconductor body may wholly consist of a semiconductor layer deposited on a carrier body, for example, metallic or ceramic. Therefore another important embodiment of the method according to the invention is characterized in that a semiconductor body is used comprising, at least in part, a semiconductor layer deposited on a carrier body from the gaseous phase and that the said semiconductor layer is also provided on the carrier body in the same reaction vessel by leading over a gas from which semiconductor material is deposited on the carrier body by heating the carrier body.

It is to be noted that it has previously been suggested in itself to apply a semiconductor layer and a silicon-oxide layer to a semiconductor body in succession and in the same reaction vessel. See the aforementioned copending application.

The invention is especially important for the manufacture of semiconductor devices comprising a silicon body and such a semi-conductor body is therefore preferably used. However, it is possible to use semiconductor bodies of other semiconductor material on which a silicon layer may be grown, for example a semiconductor body consisting of an $A_{III}B_{V}$ compound the structure of which closely approaches that of silicon such as AlP.

The invention also relates to a semiconductor device manufactured by the use of a method according to the invention, comprising a semiconductor body provided, at least locally, with a silicon-oxide layer a removed portion of which contains a silicon layer grown on the semiconductor body.

In order that the invention may be readily carried into effect, it will now be described in detail, by way of example, with reference to the accompanying diagrammatic drawings, in which.

Figures 1, 2, 3:
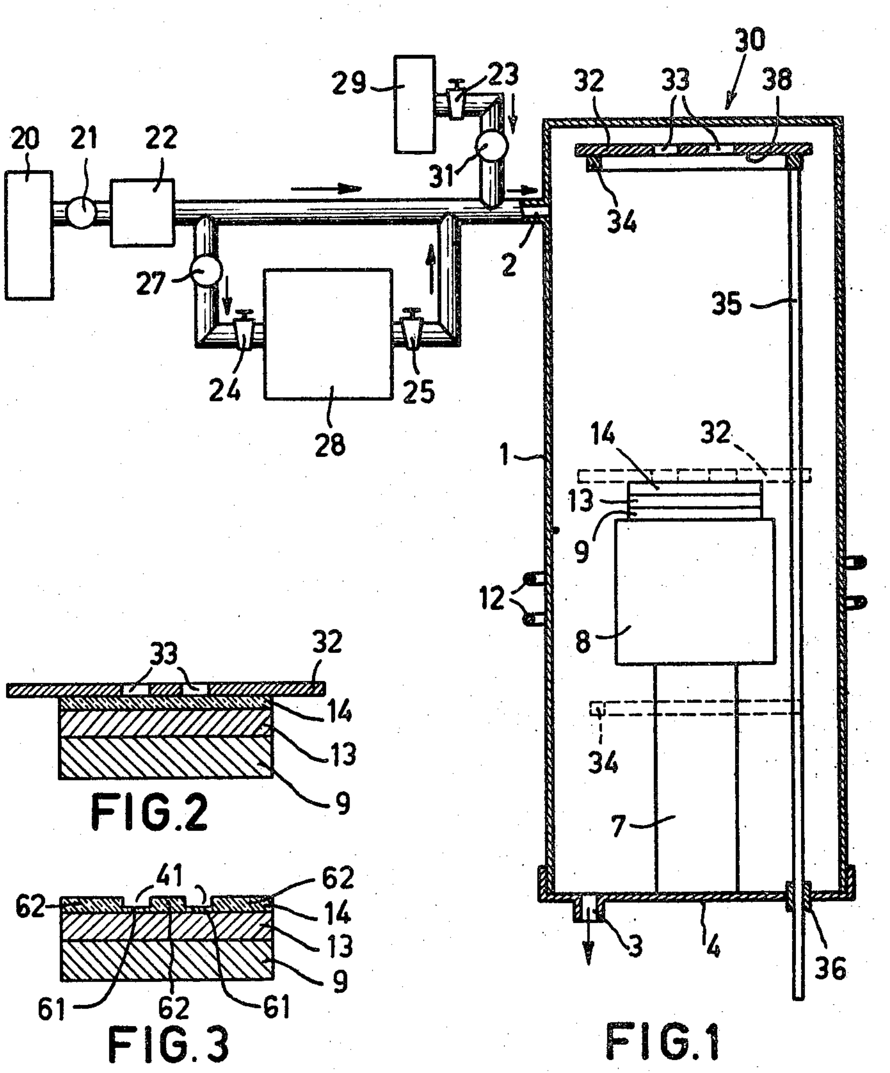
FIGURE 1 shows an example of an arrangement for carrying out a method according to the invention.
FIGURE 2 is a cross-sectional view of a semiconductor body provided with the silicon-oxide layer and a mask.
FIGURE 3 is a cross-sectional view of the same semiconductor body as in FIGURE 2, but in which the oxide layer has been locally removed in part.

In the example shown in FIGURE 1 of a device for carrying out a method according to the invention for the manufacture of semiconductor devices start is made from a semiconductor body (9, 13) which has, at least locally, a silicon-oxide surface layer 14 which is removed at least locally, whereafter a silicon layer is grown on the semiconductor surface that has thus come free by leading over a gas containing a silicon compound from which silicon deposits on the said semiconductor surface due to thermal reactions as a result of heating of the semiconductor body (9, 13).

According to the invention the silicon-oxide layer 14 is removed and the silicon layer is grown in succession in the same reaction vessel 30 constituted by a quartz tube 1, closed at its upper end, having a gas inlet 2 and a removable base piece 4 having a gas outlet 3, the at least local removal of the silicon-oxide layer 14 also being effected by leading over a gas from which silicon may be deposited by means of thermal reactions, the rate of flow of the gas and the temperature of the semiconductor body (9, 13) being adjusted to values at which silicon may be liberated from the gas, while substantially no silicon is permanently deposited on the silicon-oxide layer 14. A simple method is thus obtained in which the risk of contamination of the semiconductor body is minimized.

The base piece 4 is provided with a support 7, for example of quartz, which in turn bears a support 8, for example of molybdenum, silicon or carbon. The semiconductor body (9, 13) is placed on the support 8.

The support 8 may be heated by means of a high-frequency heating coil 12 by which the semiconductor body (9, 13) is also heated.

In the present example a semiconductor body (9, 13) or silicon will be used which comprises a carrier body 9 of silicon and a silicon layer 13 which is deposited on it from the gaseous phase.

In one important preferred embodiment of a method according to the invention, which will now be described, the layer 13 and also the silicon-oxide layer 14 are likewise provided in the reaction vessel 30 by leading over a gas from which silicon and silicon-oxide respectively are precipitated due to thermal reactions. Consequently a large portion of the semiconductor devices is manufactured in the same reaction vessel 30 so that the method is considerably simplified and the risk of undesirable contamination is very small indeed.

At first a carrier body comprising a silicon plate 9 is placed on the support 8. The silicon plate 9 is, for example, 300 microns thick, 2 mm. in diameter, has a specific resistance of 0.01Ω–cm. and, for example, n-type conductivity.

From a gas cylinder 20 hydrogen is supplied for about 10 minutes via a gasometer 21 and a gas-purifying installation 22 through the inlet 2 to the reaction vessel 30 and removed through the outlet 3 for the purpose of cleaning the reaction vessel 30. 1 litre of hydrogen per minute, for example, is led through at a pressure of about 1 atmosphere. During this process the cocks 23, 24 and 25 are closed.

Next the plate 9 is heated for about 10 minutes at a temperature of about 1300° C. by means of the high-frequency heating coil 12. As a result any oxides present on the surface of the plate 9 are removed.

The temperature of the plate 9 is then reduced to a value between 1250° C. and 1260° C., the cocks 24 and 25 are opened and a gasometer 27 is adjusted to 30 cc. of gas per minute while the gasometer 21 is still passing 1 litre of hydrogen per minute. Thus 30 cc. of hydrogen per minute flows through an evaporator 28 in which silicon chloride ($SiCl_4$) is evaporated. The evaporator 28 is maintained at, for example, 20° C. The hydrogen of about 1 atmosphere which flows through the inlet 2 into the reaction vessel 30 then contains about 1% by volume of silicon chloride.

The rate of growth of a silicon layer 13 on the silicon plate 9 is under the said conditions about 1 micron per minute.

It will be evident that it is also possible to use other gases which are usually employed in the semiconductor technique for depositing silicon, for example, hydrogen or argon to which silane is added. Also the $SiCl_4$ may be replaced by, for example, $SiHCl_3$.

After the desired thickness, for example, 14 microns for the silicon layer 13 is reached the silicon-oxide layer 14 is deposited. In the present example this may be effected in a simple manner by adding to the gas oxygen, for example, in the form of carbonic acid. The carbonic acid is added from a gas cylinder 29 via a gasometer 31 by opening the cock 23. The gasometer 31 is adjusted, for example, to a gas flow of 20 cc. per minute. The gas flowing into the reaction vessel 30 via the inlet 2 again has an approximately atmospheric pressure.

The rate of growth of the silicon-oxide layer is approximately 0.2 microns per minute.

When the desired thickness, for example, 3 microns for the oxide layer is reached the supply of carbonic acid is stopped by closing the cock 23.

The sides and the bottom of the semiconductor body (9, 13) may also be covered with the oxide layer (not shown in the drawing), however this layer may be removed during the following step in which the oxide layer in partly removed and/or afterwards in a known manner for instance by grinding and/or etching.

A mask 32 is then placed on the silicon-oxide layer 14 (this position of the separate mask 32 as shown in broken line). The mask 32 comprises a plate provided with recesses 33, for example, 300 microns in diameter, and made from a material which can withstand the temperature to which the semiconductor body is heated. The mask 32 consists, for example, of molybdenum and has a thickness of, say, from 300 to 400 microns. The lower side 38 of the mask, which has been ground optically flat, comes to bear on the silicon-oxide layer 14. Instead of molybdenum, the mask 32 may consist of, for example, quartz, silicon, carbon or tungsten.

During the preceding treatments the mask 32 bears on a ring 34. Connected to the ring 34 is a rod 35 which projects from the reaction vessel 30 via a rubber ring 36. By moving the rod 35 downwards, the mask 32 comes to lie on the silicon-oxide layer 14 and the ring 34 assumes, for example, the lower position shown in broken lines.

The ring 34 and the mask 32 may be resiliently connected together so that the mask 32 may be pulled on the silicon-oxide layer with a slight force.

The gasometer 21 is adjusted to 0.25 litre of gas per minute, whereas the gasometer 27 is adjusted to a correspondingly smaller amount of gas (7.5 cc.) per minute, so that the hydrogen flowing into the reaction vessel 30 via the inlet 2 again contains about 1% by volume of silicon chloride. The pressure of the hydrogen remains approximately atmospheric.

For obtaining satisfactory results it is preferable to heat the semiconductor body to a temperautre of at least 1200° C. The temperature of the semiconductor body preferably lies in the region between 1250° C. and 1350° C. Thus the semiconductor body is heated, for example, to a temperature of about 1314° C.

It is to be noted that the rate of flow of the gas (hydrogen with silicon chloride) in the vicinity of the semiconductor body must be comparatively low, for example, lower than 30 cm. per minute. However, the rate of flow in the vicinity of the semiconductor body (9, 13) is difficult to determine and greatly depends upon the structure of the apparatus used. The correct amount of gas which must be passed through per minute can, however, be determined experimentally in a simple manner for any type of reaction vessel.

The silicon-oxide layer 14 is now removed at the recesses 33 (shown on a larger scale in FIGURE 2).

This removal is probably attributable, at least substantially, to the fact that the silicon liberated by thermal reaction from the gas being led over, which consists of hydrogen and silicon chloride, reacts with the silicon oxide of the layer 14, resulting in silicon monoxide which is volatile and leaves the reaction vessel through the outlet 3. This makes clear that also other gasses from which silicon can be liberated may be used for instance hydrogen with $SiHCl_3$ or silane.

Figure 4:
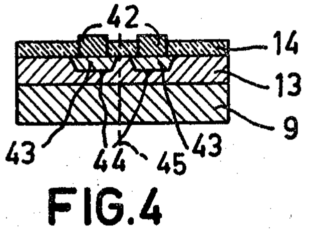
FIGURE 4 is a cross-sectional view of a plurality of diode structures obtained by means of a method according to the invention.

After some time cavities 41 are thus formed in the silicon-oxide layer 14 (see FIGURE 3), which cavities reach the silicon body (9, 13) after about 10 minutes, whereafter silicon layers 42 are deposited in the said cavities (see FIGURE 4) without changing anything of the conditions adjusted. The layers 42 are allowed to grow, for example, up to a thickness of about 10 microns. The rate of growth of the layers 42 is approximately from 0.5 micron to 0.6 micron per minute.

During the growth of the silicon layers 42 the mask 32 may be removed from the oxide layer 14 by lifting the rod 35 (see FIGURE 1). Polycrystalline silicon may have been deposited on the mask 32, but this is not disadvantageous to the method. During the growth of the silicon layers 42 no silicon or substantially no silicon is permanently deposited on the remaining portion of the oxide layer 14. However, this remaining portion becomes thinner for the same reason which has first given rise to the formation of the cavities 41. Difficulties do not arise therefrom since the silicon layers 42 grow at a much higher rate (higher by approximately a factor of 10) than the oxide layer 14 is removed.

Impurities may be added to the hydrogen in the manner usual in the semiconductor technique, in order to determine the specific resistance and the conductivity type of the layers deposited.

Thus the layer 13, which has been deposited on the n-type carrier body 9 having a specific resistance of about 0.01Ω-cm., has a specific resistance of, for example, about 1Ω-cm. and likewise n-type conductivity, whereas the silicon layers 42 have a specific resistance of, for example, 0.01Ω-cm. and p-type conductivity due to the addition of p-type impurities, for example, in the form of boron.

The cocks 24 and 25 are now closed and the semiconductor body (9, 13) is maintained at the specified temperature in an atmosphere of hydrogen for about another 30 minutes so that the p-type impurities diffuse into the n-type layer 13 and produce in situ diffused p-type zones 43 of about 3 microns thick and p-n junctions 44. The p-n junctions 44 are shielded from the ambience by the oxide layer 14 at the area where they appear at the surface of the layer 13, which has a favourable influence on the electrical properties of the p-n junctions 44.

The supply of hydrogen is now stopped and the heating of the semiconductor body (9, 13) switched off, whereafter the semiconductor body may be removed from the reaction vessel 30.

The semiconductor body (9, 13) may be subdivided along the dotted line 45 for example, by scratching with a diamond and breaking, so that individual diodes of a $p\text{-}n^+$-type structure are obtained, which may be provided with terminal contacts in a manner usual in the semiconductor technique.

To obtain satisfactory results, the temperature of the semiconductor body (9, 13) during the local removal of the oxide layer 14 and the growth of the silicon layers 42 may considerably differ from the temperature specified in the example above described. Also the amount of hydrogen supplied per minute through the inlet 2 to the reaction vessel 30 may considerably differ from the quantity specified.

Figure 5:
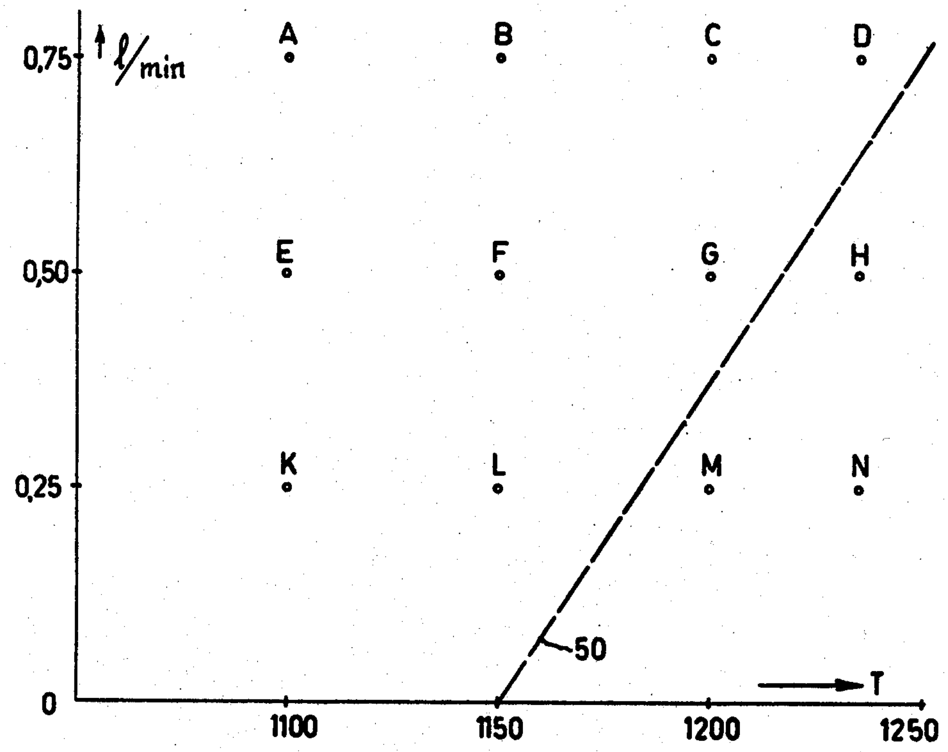
FIGURE 5 is a graph showing results of several experiments carried out with methods according to the invention.

For the described apparatus in which hydrogen containing about 1% by volume of silicon chloride is supplied to the reaction vessel 30, experiments have been made several of which are shown graphically in FIGURE 5. The total amount of hydrogen containing about 1% by volume of $SiCl_4$ that is supplied in litres per minute to the reaction vessel 30 is plotted along the vertical axis and the temperatures of the silicon body (9, 13) with the oxide layer 14 are plotted along the horizontal axis.

A polycrystalline silicon layer was obtained on the oxide layer 14 at the points of adjustment A, B, E, F and K. The silicon-oxide layer was removed at the desired areas only in part at the points of adjustment C, D, G and L, while locally polycrystalline silicon was permanently deposited on the oxide layer 14. The silicon-oxide layer was removed at the desired areas at the points of adjustment H, M and N and then silicon-selectively deposited on the portions of the semiconductor surface thus exposed. So the preferred field of operation lies approximately to the right of line 50. It is to be noted that the temperatures 1100° C., 1150° C., 1200° C. and 1250° C. indicated along the horizontal axis are the temperatures adjusted by means of a pyrometer. However, these temperatures are not exactly equal to the actual temperatures of the semiconductor body. A correction is necessary to obtain the actual temperatures. The temperatures adjusted by means of a pyrometer approximately correspond to the actual temperatures 1160° C., 1220° C., 1275° C. and 1330° C. So the temperature of the semiconductor body will be chosen to be approximately 1200° C. or higher and preferably in the region between 1250° C. and 1350° C. The flow of hydrogen and the temperature of the semiconductor body corresponding to point N have been used in the embodiment described hereinbefore.

It will be evident that the preferred field of operation will be different when using gases other than hydrogen with silicon chloride, for example, hydrogen with $SiHCl_3$ or with silane. Furthermore the amount of gas which has to be supplied per minute to the reaction vessel greatly depends upon the shaping of the apparatus. However, the amount required for a given apparatus can be determined experimentally in a simple manner.

In another important embodiment of a method according to the invention, an example of which will be described hereinafter, use is made of a semiconductor body with a silicon-oxide layer having thin and thick portions, the silicon-oxide layer being removed only at the thin portions and the silicon layer being grown at the semiconductor surface that has come free, whereas at the thick portions only the thickness of the silicon-oxide layer decreases. The use of a separate mask during the local removal of the silicon-oxide layer is in this case not required, thus also avoiding the risk that, during the local removal of the silicon layer, the gas being led over may penetrate between oxide layer and the mask so that the silicon-oxide layer might also be removed from undesired areas.

In the present example, for the local removal of the silicon oxide layer start is made from a semiconductor body (9, 13) having a silicon-oxide layer 14 as shown in FIGURE 3. The method is otherwise accomplished in the same manner as in the embodiment previously described after reaching a configuration as shown in FIGURE 3, except that the mask 32 is absent and during the removal of the thin portions 61, the thick portions 62 exhibit a decrease in thickness equal to the thickness of the thin portions 61.

Figure 6:
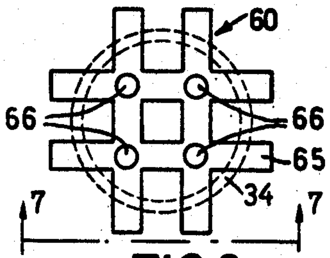
FIGURES 6 and 7 are a plan view and a side view, respectively, in a direction indicated by the arrows in FIGURE 6, of a mask used in one example of a method according to the invention.
Figure 7:
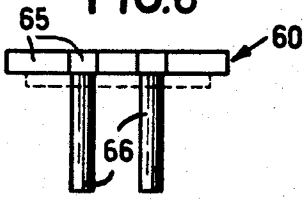
Figure 8:
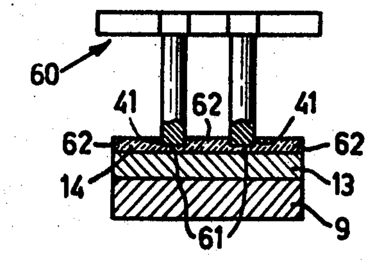
FIGURE 8 is a cross-sectional view of a semiconductor body provided with an oxide layer on which the mask of FIGURES 6 and 7 is placed.

The silicon layer 13 and the oxide layer 14 may be provided in a similar manner as in the embodiment previously described, except that upon reaching a thickness of about 0.5 micron for the silicon-oxide layer 14, a mask 60 of the kind shown in FIGURES 6 and 7 is placed on the said layer, resulting in the recesses 41 being formed in it during the further growth of the silicon-oxide layer 14 (see FIGURE 8). After removal of the mask 60, the thin portions 61 of the layer 14 may be removed as above described.

The mask 60 comprises a raster 65 having limbs 66 and is made, for example, of carbon or molybdenum. The mask 60 may be placed with its raster 65 on the ring 34 shown by the dotted line outline (see also FIGURE 1) with the limbs 66 directed downwards and be placed on the oxide layer 14 and removed therefrom in a similar manner as described with reference to the mask 32. The limbs 66 each have a length of, say, about 2 cm. and a diameter of 1 mm., the silicon plate 9 used being about 6 mm. in diameter.

Figure 9:
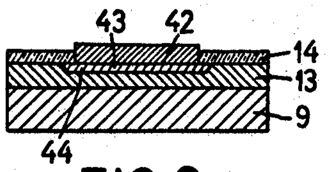
FIGURE 9 is a cross-sectional view of a diode structure obtained by the use of a method according to the invention.

In the preceding embodiments the manufacture of diode structures has been described. It will be evident, however, that a method according to the invention is applicable to the manufacture of many kinds of semiconductor devices. Transistors may be manufactured, for example, as follows:

At first, for example, a $p\text{-}n\text{-}n^+$ type diode structure, as shown in FIGURE 9, is manufactured. The diode structure of FIGURE 9, is of the same kind as described with reference to FIGURE 4 and may be manufactured in a similar manner.

Figure 10:
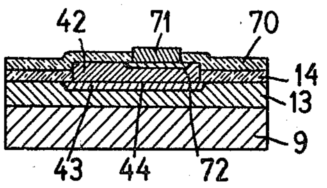
FIGURE 10 is a cross-sectional view of a transistor structure obtained by the use of a method according to the invention.

An oxide layer 70 and an $n^+$ type silicon layer 71 are applied in a similar manner as the oxide layer 14 and the p-type silicon layer 42 have been provided (see FIGURE 10). P-n junctions 44 and 72, respectively, are obtained by diffusion of impurities incorporated in the silicon layers 42 and 71. The resulting assembly is an $n^+$-p-n-$n^+$ transistor structure the p-n junctions 44 and 72 of which are shielded from the ambience by the oxide layers 14 and 70, respectively, at the area where they appear at the surfaces of the layers 13 and 42, respectively, which has a favourable influence on the electrical properties of the transistor structure. The layers 71 and 42 and the carrier body 9 may be provided with terminal contacts in a manner usual in the semiconductor technique, the terminal contact for the layer 42 having to penetrate through the oxide layer 70.

For the manufacture of composite semiconductor devices, sometimes referred to as "solid circuits," silicon layers may be locally provided on a semiconductor carrier plate provided with an oxide layer, by a method according to the invention, which silicon layers may be further worked into, for example, transistor structures and/or diode structures.

Figure 11:
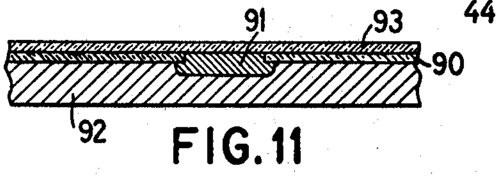
FIGURE 11 is a cross-sectional view of a semiconductor plate provided with silicon-oxide layers and a grown silicon layer obtained by the use of a method according to the invention.

It will be evident that the invention is not limited to the embodiments described and that many variations are possible to an expert without passing beyond the scope of the invention. Thus, it is possible, for example, as shown in FIGURE 11, after the local removal of an oxide layer 90 and before a silicon layer 91 is grown, to remove part of a silicon body 92 so that the silicon layer 91 comes to lie, at least in part, in the silicon body 92. Part of the silicon body 92 may be removed, for example, in known manner by leading over hydrogen containing a sufficiently high concentration of $SiCl_4$ and/or adding HCl to the hydrogen. The silicon body 92 may be, for example, high-ohmic or intrinsic, whereas the grown layer 91 is low-ohmic. The layer 92 may have the shape of a band and be covered, for example, with a second oxide layer 93. It will be evident that, for example, a plurality of transistors and/or diode structures may be provided on the band-shaped layer 91, which is very important for the manufacture or composite semiconductor devices. Besides the portions removed from the oxide layer may have any arbitrary shape, if the limbs of the mask 60 in FIGURES 6, 7 and 8 have, for example, a star-shaped section the oxide layer 14 may be removed from star-shaped areas, whereafter star-shaped silicon layers may be grown. The semiconductor body on which the oxide layer is provided which must be locally removed may wholly consist of a semiconductor layer deposited, for example, on a metallic or ceramic carrier. The semiconductor body need not be of silicon and may be made of any arbitrary semiconductor material which can withstand the temperatures required for a method according to the invention and which approaches the crystalline form of silicon, for example, made of $A_{III}B_V$ compound such as AlP. When using a semiconductor body comprising, at least in part, a semiconductor layer deposited from the gaseous phase and on which the oxide layer is provided, this semiconductor layer and the oxide layer may be provided in an apparatus different from that in which the oxide layer is removed at least locally.

I claim:

1. In a method of manufacturing semiconductor devices wherein at least a portion of a silicon oxide layer covering the surface of a semiconductive body is removed to expose a surface portion of the body on which is vapor deposited a layer of silicon by thermal decomposition of a silicon compound-containing gas while heating the body, in combination with the improvement comprising, within the same reaction vessel in which the silicon layer is vapor deposited and without removing said semiconductive body therefrom between the removal and depositing steps, carrying out the oxide-removal step by introducing into the vessel a silicon compound-containing gas at a flow rate and while heating the body at a temperature at which the gas is thermally decomposed to liberate silicon which when contacting the oxide portions to be removed causes their removal.

2. A method as set forth in claim 1 wherein the oxide layer has a small thickness at the portions to be removed and a larger thickness elsewhere, and the whole oxide surface is exposed to the thermally decomposable gas causing removal of the thin oxide portions followed by growth of a silicon layer on the exposed silicon body regions while the thicker oxide layer portions are decreased in thickness.

3. A method as set forth in claim 1 wherein the silicon oxide layer is initially vapor deposited on the body within the same reaction vessel by flowing through the vessel a thermally decomposable gas compound.

4. A method of manufacturing a semiconductor device from a monocrystalline silicon body having a surface covered with a silicon oxide layer, comprising the steps of masking selected portions of the layer to be removed, providing said body within a reaction vessel, flowing through the vessel a thermally-decomposable silicon compound-containing gas at a flow rate and while heating the body at a temperature at which the gas is thermally decomposed to liberate silicon which upon contacting the exposed oxide portions to be removed causes their removal exposing the underlying silicon, and continuing to flow through the same reaction vessel the same gas at the same flow rate while maintaining the body at the same temperature to automatically epitaxially vapor-deposit a monocrystalline layer of silicon on the silicon regions exposed during the oxide-removal step.

5. A method as set forth in claim 4 wherein the gas comprises hydrogen and a silicon-halogen compound, and the temperature of the body is maintained at a temperature in excess of 1200° C.

6. A method as set forth in claim 4 wherein the body is placed inside the reaction vessel and masked by bringing into contact with the oxide layer a masking plate while the body is within the vessel.

References Cited

UNITED STATES PATENTS 3,144,366 8/1964 Rideout et al. ------ 156—17 X
3,156,591 11/1964 Hale et al. ---------- 156—17

ALFRED L. LEAVITT, *Primary Examiner.*

JOHN H. NEWSOME, *Assistant Examiner.*